(12) United States Patent  
Sun et al.

(10) Patent No.: US 9,000,858 B2  
(45) Date of Patent: Apr. 7, 2015

(54) ULTRA-WIDE BAND FREQUENCY MODULATOR

(75) Inventors: Bo Sun, Carlsbad, CA (US); Alexander Dorosenco, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 299 days.

(21) Appl. No.: 13/490,746

(22) Filed: Jun. 7, 2012

(65) Prior Publication Data

US 2013/0287065 A1    Oct. 31, 2013

Related U.S. Application Data

(60) Provisional application No. 61/638,274, filed on Apr. 25, 2012.

(51) Int. Cl.
| | |
|---|---|
| *H03C 3/02* | (2006.01) |
| *H03C 5/00* | (2006.01) |
| *H04L 27/20* | (2006.01) |
| *H03C 3/09* | (2006.01) |

(52) U.S. Cl.
CPC .............. *H03C 3/02* (2013.01); *H04L 27/2003* (2013.01); *H03C 3/0966* (2013.01); *H03C 3/095* (2013.01); *H04L 27/2032* (2013.01); *H03C 5/00* (2013.01)

(58) Field of Classification Search
CPC ............ H03C 3/00; H03C 3/02; H03C 3/095; H03C 3/0966; H03C 3/005; H03C 3/0908; H03C 5/00; H04L 27/20; H04L 27/2003; H04L 27/2007; H04L 27/2032

USPC ................ 332/119, 120, 127, 128, 144, 145; 375/302

See application file for complete search history.

(56) References Cited

U.S. PATENT DOCUMENTS

| | | |
|---|---|---|
| 4,720,685 A | 1/1988 | Garuts |
| 5,491,673 A | 2/1996 | Okayasu |
| 5,701,594 A | 12/1997 | Bath et al. |
| 5,729,179 A | 3/1998 | Sumi |
| 5,907,253 A | 5/1999 | Davis et al. |
| 5,929,682 A | 7/1999 | Kazuya et al. |
| 5,937,339 A | 8/1999 | Vigne |
| 6,160,856 A | 12/2000 | Gershon |
| 6,185,411 B1 | 2/2001 | Gillig et al. |

(Continued)

FOREIGN PATENT DOCUMENTS

| | | |
|---|---|---|
| CN | 1600009 A | 3/2005 |
| CN | 1983820 A | 6/2007 |

(Continued)

OTHER PUBLICATIONS

Arias, et al., "Nonlinearity Correction for Multibit ? ? DACs," IEEE Transactions on Circuits and Systems-I, Regular Papers, vol. 52, No. 6, Jun. 2005, pp. 1033-1041.

(Continued)

*Primary Examiner* — Ryan Johnson  
(74) *Attorney, Agent, or Firm* — James Gutierrez

(57) ABSTRACT

An ultra-wide band frequency modulator is disclosed. The frequency modulator includes a direct modulation phase lock loop that receives a small component. The frequency modulator also includes a delay module that produces a plurality of delay lines. The frequency modulator further includes an edge selector that receives a large component and the plurality of delay lines.

25 Claims, 10 Drawing Sheets

(56) References Cited

U.S. PATENT DOCUMENTS

| | | | |
|---|---|---|---|
| 6,563,387 | B2 | 5/2003 | Hirano et al. |
| 6,788,668 | B1 | 9/2004 | Shah et al. |
| 6,826,247 | B1 | 11/2004 | Elliott et al. |
| 7,260,375 | B2 | 8/2007 | Ash |
| 7,274,231 | B1 | 9/2007 | Gillespie et al. |
| 7,482,885 | B2 | 1/2009 | Sridharan |
| 7,483,508 | B2 | 1/2009 | Staszewski et al. |
| 7,505,737 | B2 | 3/2009 | Park |
| 7,609,199 | B2 | 10/2009 | Nishijima et al. |
| 7,613,267 | B2 | 11/2009 | Perrott et al. |
| 7,729,440 | B2 | 6/2010 | Dussarat et al. |
| 7,817,768 | B2 | 10/2010 | Beyer et al. |
| 7,885,369 | B2 | 2/2011 | Beyer et al. |
| 7,933,359 | B2 * | 4/2011 | Lee et al. ............... 375/308 |
| 8,044,742 | B2 | 10/2011 | Sun |
| 8,085,108 | B2 * | 12/2011 | Philippe ............... 332/145 |
| 8,095,087 | B1 * | 1/2012 | Groe ............... 455/110 |
| 8,222,966 | B2 * | 7/2012 | Ravi et al. ............... 332/144 |
| 8,433,026 | B2 * | 4/2013 | Ballantyne et al. ........ 375/376 |
| 8,508,309 | B2 * | 8/2013 | McCune, Jr. ............... 332/103 |
| 8,634,512 | B2 * | 1/2014 | Leung et al. ............... 375/376 |
| 2003/0016762 | A1 | 1/2003 | Martin et al. |
| 2003/0058053 | A1 | 3/2003 | Jeon et al. |
| 2003/0067359 | A1 | 4/2003 | Darabi et al. |
| 2003/0092419 | A1 | 5/2003 | Nobbe et al. |
| 2003/0099321 | A1 | 5/2003 | Juan et al. |
| 2005/0153669 | A1 | 7/2005 | Suzuki et al. |
| 2005/0280473 | A1 | 12/2005 | Puma et al. |
| 2006/0066368 | A1 | 3/2006 | Gabato et al. |
| 2006/0198426 | A1 | 9/2006 | Partyka |
| 2007/0015471 | A1 | 1/2007 | Cook et al. |
| 2007/0049330 | A1 | 3/2007 | Kim et al. |
| 2007/0164835 | A1 | 7/2007 | Co |
| 2007/0242026 | A1 | 10/2007 | Julian et al. |
| 2007/0291875 | A1 | 12/2007 | Lee et al. |
| 2008/0003954 | A1 | 1/2008 | Matsuno |
| 2008/0037662 | A1 | 2/2008 | Ravi et al. |
| 2008/0042706 | A1 | 2/2008 | Yang et al. |
| 2008/0129386 | A1 | 6/2008 | Zipper |
| 2008/0191750 | A1 | 8/2008 | Wang |
| 2009/0163166 | A1 | 6/2009 | Lin |
| 2009/0168942 | A1 | 7/2009 | Choi et al. |
| 2009/0190694 | A1 | 7/2009 | Kobayashi |
| 2010/0136937 | A1 | 6/2010 | Shute et al. |
| 2010/0207693 | A1 | 8/2010 | Fagg |
| 2011/0143689 | A1 | 6/2011 | Ballantyne et al. |
| 2011/0275313 | A1 | 11/2011 | Baldemair et al. |
| 2011/0304368 | A1 | 12/2011 | Sun |
| 2012/0139592 | A1 | 6/2012 | Bo et al. |

FOREIGN PATENT DOCUMENTS

| | | |
|---|---|---|
| EP | 0180450 A2 | 5/1986 |
| EP | 0357527 A2 | 3/1990 |
| EP | 0788237 A1 | 8/1997 |
| JP | S6359216 A | 3/1988 |
| JP | 9261048 A | 10/1997 |
| JP | H10112669 A | 4/1998 |
| JP | 10304000 A | 11/1998 |
| JP | 2004527953 A | 9/2004 |
| JP | 2004289355 A | 10/2004 |
| JP | 2005033234 A | 2/2005 |
| JP | 2005203960 A | 7/2005 |
| JP | 2008136031 A | 6/2008 |
| JP | 4310476 B2 | 8/2009 |
| JP | 2009303212 A | 12/2009 |
| KR | 20090079110 A | 7/2009 |
| TW | 387130 B | 4/2000 |
| TW | 200718024 | 5/2007 |
| WO | WO-9706600 A1 | 2/1997 |
| WO | 9938252 A1 | 7/1999 |
| WO | 02080484 A1 | 10/2002 |
| WO | 2007046061 A2 | 4/2007 |

OTHER PUBLICATIONS

Balabanian, et al., "Digital Logic Design principles", John Wiley & sons publishing, 2001, ISBN 0-471-29351-2, pp. 142-145.

International Search Report and Written Opinion—PCT/US2013/038286—ISA/EPO—Aug. 6, 2013.

Nagaraj, et al., "A Self-Calibrating Sub-Picosecond Resolution Digital-to-Time Converter," Microwave Symposium, 2007. IEEE/MTT-S International, Jun. 3-8, 2007, pp. 2201-2204.

Philippe, P.; , "A zero crossing avoidance predistortion technique for polar transmitters," Electronics, Circuits and Systems, 2008. ICECS 2008. 15th IEEE International Conference on , v pp. 814-817, Aug. 31, 2008-Sep. 3, 2008.

Su P. E., et al., "A 2.4 GHz Wideband Open-Loop GFSK Transmitter With Phase Quantization Noise Cancellation", IEEE Journal of Solid-State Circuits, vol. 46, No. 3, Mar. 2011, pp. 615-626.

Wang, et al., "Vector Hole Punching Technique for OFDM Signals Using Circle-Tangent Shift and Unused Tones," IEEE Transactions on Microwave Theory and Techniques, vol. 57, No. 11, pp. 2682-2691, Nov. 2009.

Youssef, et al., "A low-power wideband polar transmitter for 3G applications," Solid-State Circuits Conference Digest of Technical Papers (ISSCC), 2011 IEEE International , pp. 378-380, Feb. 20-24, 2011.

* cited by examiner

ULTRA-WIDE BAND FREQUENCY MODULATOR

CLAIM OF PRIORITY UNDER 35 U.S.C. §119

The present application for patent claims priority to Provisional Application No. 61/638,274, entitled "ULTRA-WIDE BAND FREQUENCY MODULATOR" filed Apr. 25, 2012, and assigned to the assignee hereof and hereby expressly incorporated by reference herein.

TECHNICAL FIELD

The present disclosure relates generally to wireless devices for communication systems. More specifically, the present disclosure relates to systems and methods for an ultra-wide band frequency modulator.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks to mobile devices. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple mobile devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals for different purposes.

However, like other portable electronic devices, mobile devices may be limited in the amount of data that can be transmitted and received. Furthermore, it may be desirable to simplify the processing of signals that are transmitted and received. One benefit of a wide band modulator is the ability to cover multiple frequency bands and multiple standards (such as 2G, 3G, 4G, etc.).

SUMMARY OF THE INVENTION

An ultra-wide band frequency modulator is described. The frequency modulator includes a direct modulation phase lock loop that receives a small component. The frequency modulator also includes a delay module that produces a plurality of delay lines. The frequency modulator additionally includes an edge selector that receives a large component and the plurality of delay lines.

The small component may be a phase modulation component and the large component may be a phase modulation component. The small component may be a frequency modulation component and the large component may be a frequency modulation component. The small component may include frequencies at or below 3 megahertz and the large component may include frequencies above 3 megahertz.

The direct modulation phase lock loop may be a digital phase lock loop. The small component may be injected into the direct modulation phase lock loop through a two point injection.

The ultra-wide band frequency modulator may be a polar modulator. The direct modulation phase lock loop may provide a phase lock loop output signal to the delay module. A plurality of delayed signals may be sent over the plurality of delay lines. The edge selector may process the large component and the plurality of delayed signals to produce a phase output signal.

A method for facilitating wireless communication in a wireless network is also described. A small component is processed by a direct modulation phase lock loop. A large component is processed by a digital frequency offset generator that includes a delay module and an edge selector. The delay module provides a plurality of delay lines to the edge selector. A phase output signal is output.

Modulation data may be obtained. The modulation data may be divided into an amplitude component and a frequency component. The frequency component may be divided according to a threshold value to obtain the small component and the large component. The small component may be provided to the direct modulation phase lock loop. The large component may be provided to the digital frequency offset generator.

A direct modulation phase lock loop output may be provided to the delay module. The direct modulation phase lock loop output may be processed using the delay module to obtain a plurality of delayed signals. The plurality of delayed signals may be provided to the edge selector over a plurality of delay lines. The method may be performed by a wireless device that includes an ultra-wide band frequency modulator.

An apparatus for facilitating wireless communications in a wireless network is also described. The apparatus includes means for processing a small component by a direct modulation phase lock loop. The apparatus also includes means for processing a large component by a digital frequency offset generator that includes a delay module and an edge selector. The delay module provides a plurality of delay lines to the edge selector. The apparatus further includes means for outputting a phase signal.

A computer-program product for facilitating wireless communications in a wireless network is also described. The computer-program product includes a non-transitory tangible computer-readable medium having instructions thereon. The instructions include code for causing a wireless device to process a small component by a direct modulation phase lock loop. The instructions also include code for causing the wireless device to process a large component by a digital frequency offset generator that includes a delay module and an edge selector. The delay module provides a plurality of delay lines to the edge selector. The instructions further include code for causing the wireless device to output a phase signal.

DETAILED DESCRIPTION

Figure 1:
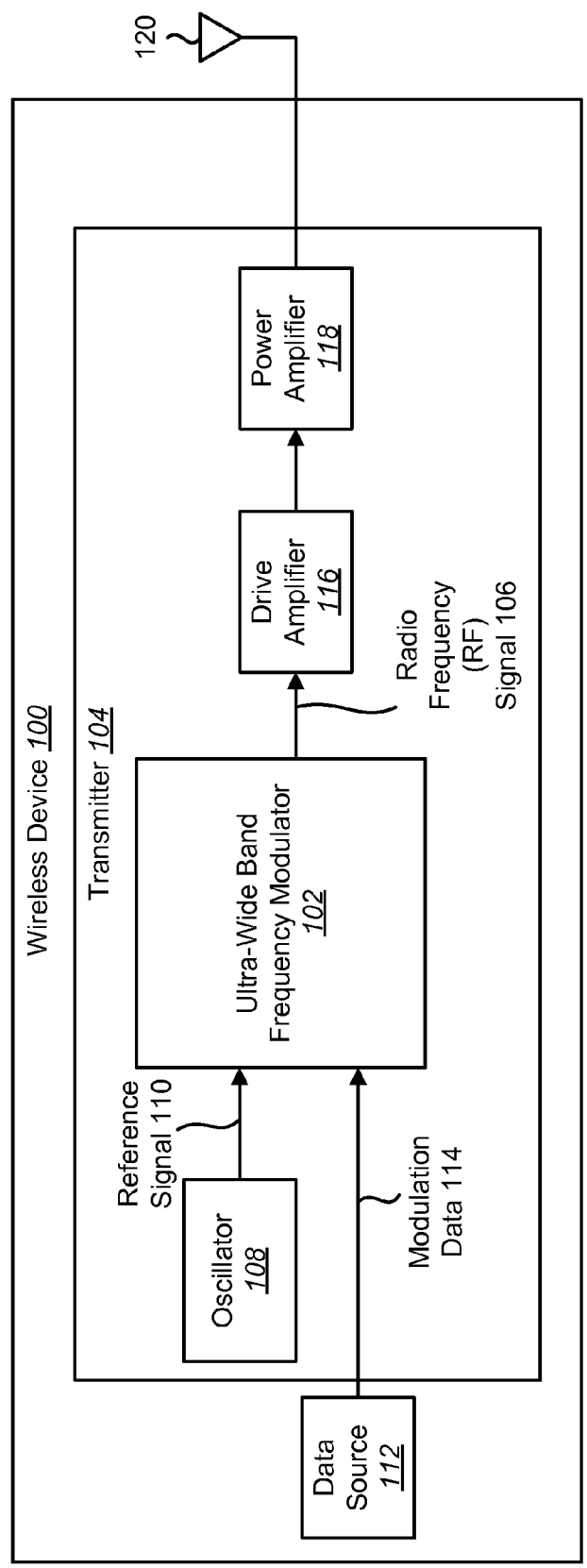
FIG. 1 is a block diagram illustrating a wireless device that uses an ultra-wide band frequency modulator.

FIG. 1 is a block diagram illustrating a wireless device 100 that uses an ultra-wide band frequency modulator 102. The wireless device 100 may be a wireless communication device or a base station.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

A wireless communication device may operate in a wireless communication system that includes other wireless devices, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communications in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, 3rd Generation Partnership Project (3GPP) Long Term Evolution (LTE) systems and spatial division multiple access (SDMA) systems.

The wireless device 100 may include a data source 112 and a transmitter 104. The transmitter 104 may include an ultra-wide band frequency modulator 102.

Examples of the wireless device 100 include a wireless communication device such as a cellular, cordless, Personal Communication System, mobile phone or other type of wireless telephone device. Further examples of the wireless device 100 include a baseband circuit, a transmitter, a receiver, a transceiver, a pager, a wireless personal digital assistant, a set top box, a music player, a video player, an entertainment unit, a notebook computer with wireless access, a wireless mobile device, a two-way radio, a walkie-talkie, a mobile station, a multiple input, multiple output (MIMO) device, navigation device, a Global Positioning System receiver, a fixed location data unit such as meter reading equipment or any other device that stores or retrieves data or computer instructions, or any combination thereof. Additional examples of the wireless device 100 include a polar transmitter, such as those found in narrowband polar GSM and EDGE systems, as well as other narrowband systems, such as Bluetooth.

An ultra-wide band frequency modulator 102 may operate on an ultra-wide band frequency. An ultra-wide band frequency may refer to a signal having bandwidth exceeding the lesser of 500 megahertz (MHz) or 20% of the carrier frequency. In general, the range of an ultra-wide band frequency modulator 102 is over 100 MHz.

The transmitter 104 may also include an oscillator 108, a drive amplifier 116 and a power amplifier 118. The ultra-wide band frequency modulator 102 may receive a reference signal 110 from the oscillator 108 and modulation data 114 from the data source 112. The oscillator 108 may be a local oscillator (LO). The modulation data 114 may include complex signals. The modulation data 114 may be any digital complex modulation scheme (PSK, QAM or OFDM). The reference signal 110 may be a periodic signal at a particular frequency (i.e., the reference signal frequency) that is used by digital components in the transmitter 104 as a clock signal. The modulation data 114 may be the data that is to be wirelessly transmitted by the wireless device 100 to another device.

The transmitter 104 may process the modulation data 114 in a way to prepare it for transmission. The transmitter 104 may produce a radio frequency (RF) signal 106 that includes the modulation data 114. For example, if the modulation data 114 has a bandwidth of 100 kilohertz (kHz), the radio frequency (RF) signal 106 may include the modulation data 114 with a bandwidth of 100 kHz and a center frequency of 1 GHz or 1.8 GHz. Before the radio frequency (RF) signal 106 is transmitted via an antenna 120, it may be amplified by a drive amplifier 116, a power amplifier 118 or both. Thus, the transmitter 104 may use the ultra-wide band frequency modulator 102 to up-convert data into the radio frequency range for transmission. In one configuration, the ultra-wide band frequency modulator 102 may use an analog phase locked loop in combination with a mixer (not shown).

Frequency modulators, such as polar transmitters, may be used in circuitry for a variety of reasons. Recently, polar transmitters have been employed on the narrow band in wireless communication devices. For example, narrowband polar transmitters are used in Global System for Mobile Communications (GSM) and Enhanced Data rates for GSM Evolution (EDGE) systems. However, using polar transmitters on the narrow band creates limitations. For example, narrow band transmitters can only utilize a small portion of the carrier signal to transmit modulated data. Another limitation is that stringent restrictions on delay matching are imposed. For example, in some systems, the voltage controlled oscillator gain (KVCO) linearization range is limited in the phase component to a bandwidth of about 3 MHz.

Another problem with polar transmitters is that they often employ a "hole punching" technique. This technique may result in phase quantization noise and spurs in the frequency domain, due to the spreading effect of the modulated data. This is problematic because it creates spectral re-growth and blocks adjacent resources. In some cases, the adjacent channel noise is up to −20 decibels relative to the carrier (dBc).

Wide band transmitters and wide band modulators are currently also used in wireless communication devices. For example, wide band transmitters are used in Wideband Code Division Multiple Access (WCDMA) and 3rd Generation Partnership Project (3GPP) Long Term Evolution (LTE) systems. These wide band transmitters are also problematic. For example, these wide band transmitters introduce power and noise problems when employing in-phase (I) and quadrature (Q) direct up-conversion. For instance, I and Q Modulators (e.g., I and Q direct up-converters) suffer from bigger die sizes, higher power consumption and higher noise levels.

In general, frequency modulators, such a polar modulators, employ modulation schemes such as 8-phase shift keying (8PSK), hybrid quadrature phase-shift keying (HQPSK), orthogonal frequency division multiplexing (OFDM), Single-carrier frequency-division multiple access (SC-FDMA), Bluetooth, WCDMA and/or LTE. However, when using one of these non-constant envelope schemes, the problem of "zero crossing" or "origin crossing" arises. One current way to reduce zero crossings is for polar modulators to require digital distortion of the baseband signal. However, this technique is very complex and computationally demanding and it degrades the quality of the modulation.

In one configuration, the ultra-wide band frequency modulator 102 may be a polar modulator. Additionally, the ultra-wide band frequency modulator 102 may be associated with a frequency synthesizer. The frequency synthesizer may be capable of an ultra-wide band radio frequency (RF) signal with instantaneous frequency deviations up to 20% of the carrier frequency. For example, in the case of a 1 GHz carrier frequency, over 200 MHz may be used for transmitting data.

Figure 2:
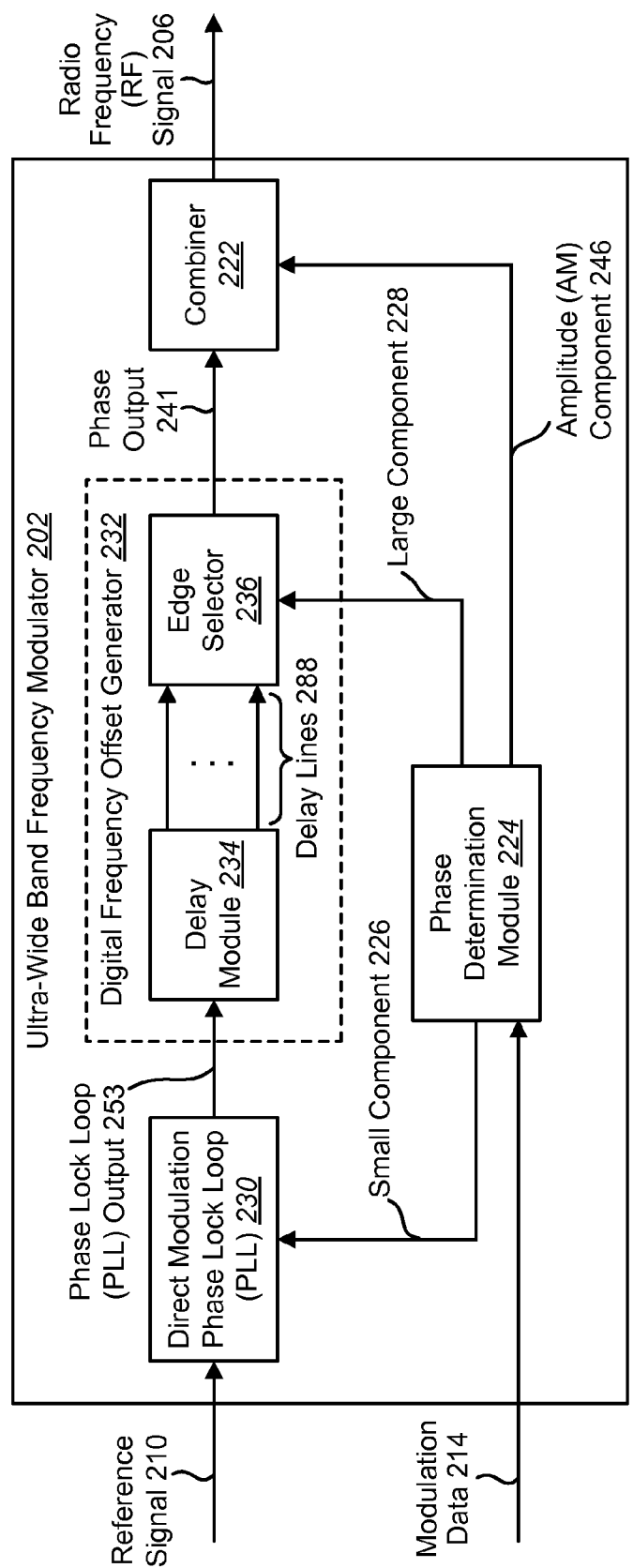
FIG. 2 is a block diagram illustrating an ultra-wide band frequency modulator.

FIG. 2 is a block diagram illustrating an ultra-wide band frequency modulator 202. The ultra-wide band frequency modulator 202 of FIG. 2 may be one configuration of the ultra-wide band frequency modulator 102 of FIG. 1. The ultra-wide band frequency modulator 202 may receive a reference signal 210 and modulation data 214 and generate a radio frequency (RF) signal 206. The ultra-wide band frequency modulator 202 may include a direct modulation phase lock loop (PLL) 230, a digital frequency offset generator 232 and a phase determination module 224.

The phase determination module 224 may receive the modulation data 214. In processing modulation data 214 at the ultra-wide band frequency modulator 202, the signal may be split up into an amplitude (AM) component 246 and a frequency modulation (FM) component. This may occur, for example, at the phase determination module 224. The frequency modulation (FM) component may be further separated into a small component 226 and a large component 228. In one configuration, the small component 226 may be a small frequency modulation (FM) component and the large component 228 may be a large frequency modulation (FM) component. In another configuration, the small component 226 may be a small phase modulation (PM) component and the large component 228 may be a large phase modulation (PM) component. In some cases, the small frequency modulation (FM) component may include small frequency deviations up to approximately 3 MHz and the large frequency modulation (FM) component may include large frequency deviations up to 20% of the RF carrier frequency. The small frequency modulation (FM) component (e.g., a signal frequency less than 3 MHz) may include around 80% of the signal while the large frequency modulation (FM) component (e.g., a signal frequency greater than 3 MHz) may include around 20% of the signal.

The modulation data 214 may include in-phase (I) and quadrature (Q) components. The modulation data 214 may be provided by the wireless device 100 or another electronic device. The phase determination module 224 may be used to generate a small component 226 and a large component 228 from the modulation data 214. The phase determination module 224 is discussed in additional detail below in relation to FIG. 4.

In some configurations, the ultra-wide band frequency modulator 202 may use a direct modulation phase lock loop (PLL) 230 and a digital frequency offset generator 232. The digital frequency offset generator 232 may include a delay module 234 that provides a plurality of delay lines 288 to an edge selector 236. The small component 226 may be injected into a direct modulation phase lock loop (PLL) 230. For example, the small component 226 may be injected into the direct modulation phase lock loop (PLL) 230 via a two-point injection. Alternatively, rather than using two point modulation (TPM), the direct modulation phase lock loop (PLL) 230 may employ one point modulation. In some cases, the large component 228 may be introduced at the output of the RF voltage controlled oscillator (VCO) via delay lines 288 and edge selector 236 architecture. In other words, the large component 228 may be injected into the digital frequency offset generator 232 having delay lines 288 and an edge selector 236.

The direct modulation phase lock loop (PLL) 230 may receive the small component 226 from the phase determination module 224. The direct modulation phase lock loop (PLL) 230 may be a digital phase lock loop (DPLL). The direct modulation phase lock loop (PLL) 230 may also receive the reference signal 210. The direct modulation phase lock loop (PLL) 230 may generate a phase lock loop (PLL) output 253 that is related to the phase of the reference signal 210. For example, the direct modulation phase lock loop (PLL) 230 may use a variable frequency oscillator and a phase detector to generate a phase output 241 from the digital frequency offset generator 232 that is the same phase as the reference signal 210. The direct modulation phase lock loop (PLL) is discussed in additional detail below in relation to FIG. 5.

The digital frequency offset generator 232 may include a delay module 234 and an edge selector 236. The delay module 234 may receive the phase lock loop (PLL) output 253 from the direct modulation phase lock loop (PLL) 230. The delay module 234 may generate multiple delayed signals (e.g., delay lines 288) that are provided to the edge selector 236.

The edge selector 236 may receive the delay lines 288 from the delay module 234 and the large component 228 from the phase determination module 224. The edge selector 236 may generate a phase output 241. The edge selector 236 may, in part, use the delayed edges of the delayed phase lock loop (PLL) output (i.e., the delay lines 288) to select a phase output 241.

In some configurations, the phase output 241 may be a frequency synthesis output. In general, frequency synthesis generates a tone with high accuracy. However, modulation may be injected on top of the frequency synthesis. In other words, increased transmitting rates may be achieved by modulating the carrier by small deviations and/or injections. In some cases, 20% of the carrier frequency may be used as transmission data. For example, under the systems and methods disclosed herein, a carrier frequency of 2 GHz may utilize data transmission levels of 400 MHz. The digital frequency offset generator 232 is discussed in additional detail below in relation to FIG. 6.

As discussed above, the phase determination module 224 may also output an amplitude component 246. The amplitude component 246 may be combined with the phase output 241 at a combiner 222. The combiner 222 may output a radio frequency (RF) signal 206.

Employing an ultra-wide band frequency modulator 202 that uses a direct modulation phase lock loop (PLL) 230 to process the small component 226 and a digital offset generator to process the large component 228 may have many advantages. For example, the level of transmit (TX) noise in the receiving (RX) bands does not need to be limited by the phase quantization noise of the delay lines 288 and edge selector 236. This is because the number of large frequency modulation (FM) component deviations is relatively small compared to the small frequency modulation (FM) component deviations. As another example, delay line 288 mismatches may reduce and/or eliminate spurs in the frequency domain because of the spreading effect of the modulating data. In one configuration, the delay lines 288 may be randomized by the modulating data itself to reduce spurs.

When employing a direct modulation phase lock loop (PLL) 230, an additional advantage may include reducing the stringent oscillator linearity requirement. Further, a precise phase output may be achieved. When digital frequency offset generator 232 functions are employed, overall distortion may be reduced along with spur power. This may be because only a small portion of the time phase signal is included in the large component 228, and thus only a small portion of the signal is injected into the digital frequency offset generator 232. In some instances, the portion of the signal that makes up the large component 228 may be around 20%. Further, the digital frequency offset generator 232 may act as a local oscillator (LO) buffer a majority of the time and/or may include an open loop. This simplified structure may also provide the benefit of employing a smaller die area. Thus, another advantage of employing a direct modulation phase lock loop (PLL) 230 in an ultra-wide band frequency modulator 202 may be smaller size and simpler complexity.

Figure 3:
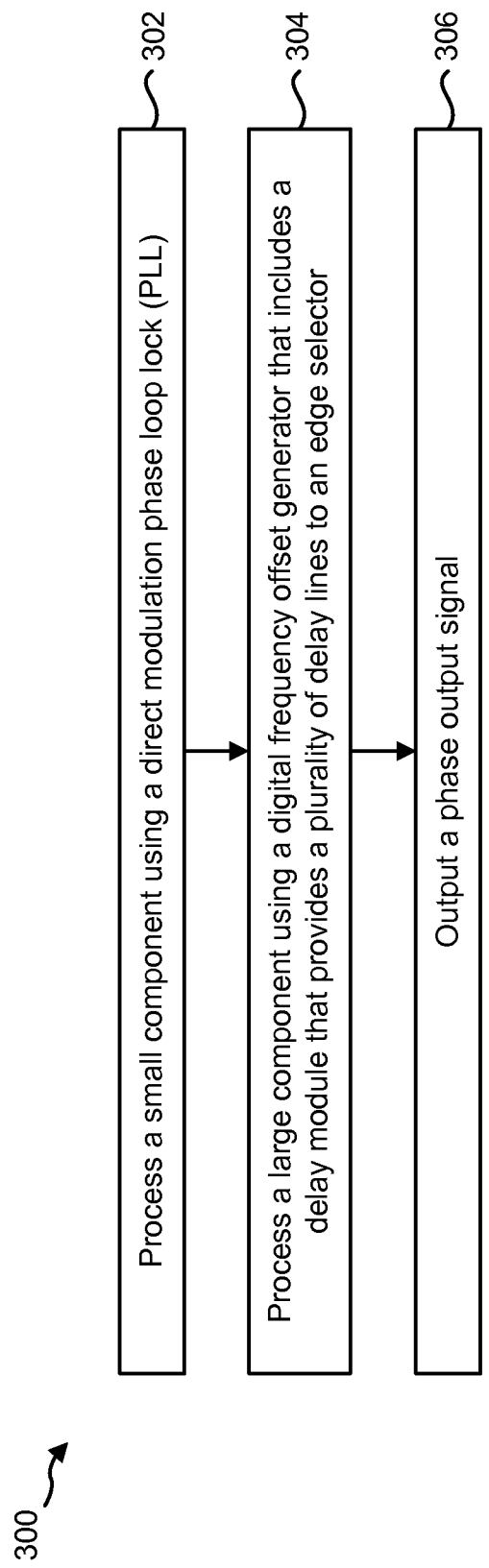
FIG. 3 is a flow diagram of a method for ultra-wideband frequency modulation.

FIG. 3 is a flow diagram of a method 300 for ultra-wideband frequency modulation. The method 300 may be performed by an ultra-wide band frequency modulator 102. In one configuration, the ultra-wide band frequency modulator 102 may be on a wireless device 100, such as a base station or a wireless communication device. The ultra-wide band frequency modulator 102 may process 302 a small component 226 using a direct modulation phase lock loop (PLL) 230. In one configuration, the small component 226 may be a small frequency modulation (FM) component that includes a frequency modulated signal.

The ultra-wide band frequency modulator 102 may process 304 a large component 228 using a digital frequency offset generator 232. As discussed above in relation to FIG. 2, the digital frequency offset generator 232 may include a delay module 234 that provides a plurality of delay lines 288 to an edge selector 236. The large component 228 may be a large frequency modulation (FM) component. In one configuration, the large component 228 may include a frequency modulated signal. The ultra-wide band frequency modulator 102 may output 306 a phase output signal 241.

Figure 4:
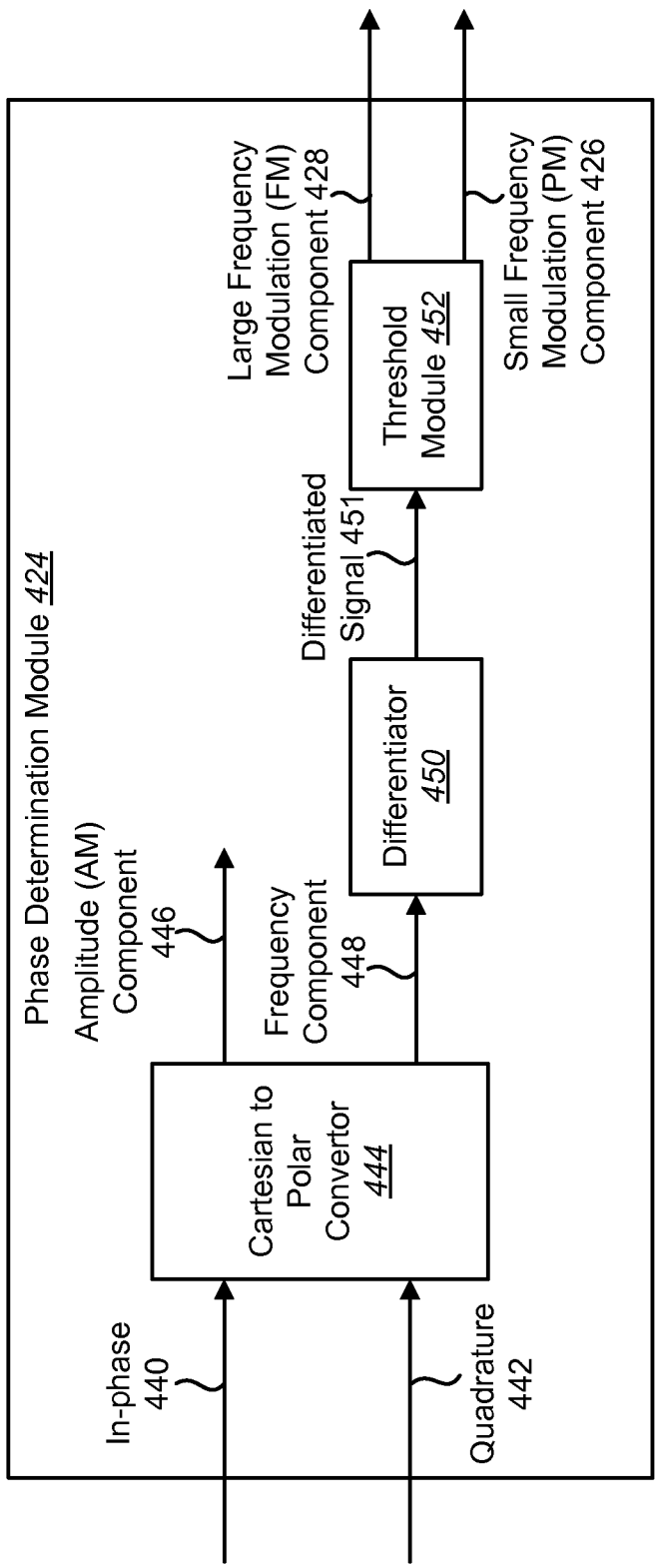
FIG. 4 is a block diagram illustrating one configuration of a phase determination module.

FIG. 4 is a block diagram illustrating one configuration of a phase determination module 424. The phase determination module 424 of FIG. 4 may be one configuration of the phase determination module 224 of FIG. 2.

The phase determination module 424 may include a Cartesian to polar convertor 444, a differentiator 450 and a threshold module 452. The Cartesian to polar convertor 444 may receive complex modulated signals in the form of modulation data 214. The modulation data 214 may include an in-phase signal component 440 and a quadrature signal component 442. The Cartesian to polar convertor 444 may convert the in-phase signal component 440 and the quadrature signal component 442 into an amplitude (AM) component 446 and a frequency component 448. The amplitude (AM) component 446 may be referred to as p and the frequency component 448 may be referred to as θ. The amplitude (AM) component 446 may be sent to the combiner 222.

The frequency component 448 may include phase information. The frequency component 448 may be sent to the differentiator 450. The differentiator 450 may produce a differentiated signal 451. The differentiator 450 may employ the function $H(Z)=1-Z^{-1}$ to create the differentiated signal 451. The differentiator 450 produces a frequency from the frequency component, which may include phase information. In other words, the differentiated signal 451 may include frequency information.

The threshold module 452 may compare the frequencies from the differentiated signal 451. If the frequency is above a certain threshold level, the threshold module 452 may output the differentiated signal 451 as a large frequency modulation (FM) component 428. If the frequency is below the threshold level, the threshold module 452 may output the differentiated signal 451 as a small frequency modulation (FM) component 426. The threshold module 452 may determine the threshold based on a threshold frequency level. For example, all frequencies above 3 MHz may be processed as a large frequency modulation (FM) component 428 while all other frequencies (e.g., all frequencies less than or equal to 3 MHz) may be processed as a small frequency modulation (FM) component 426.

A variety of threshold levels may be employed. The threshold level may be based on the direct modulation phase lock loop (PLL) 230. For example, all frequencies that the direct modulation phase lock loop (PLL) 230 is capable of processing may be output as small frequency modulation (FM) components 426 by the threshold module 452 while all other frequencies may be output as large frequency modulation (FM) components 428.

The small frequency modulation (FM) component 426 and/or the large frequency modulation (FM) component 428 may be scaled before receiving further processing. The small frequency modulation (FM) component 426 may be provided to the direct modulation phase lock loop (PLL) 230. The large frequency modulation (FM) component 428 may be provided to the digital frequency offset generator 232. For example, the large frequency modulation (FM) component 428 may be provided to a delay module 234 and/or an edge selector 236. Additionally, before scaling, the large frequency modulation (FM) component 428 may be subject to the function H(Z)=1/(1−Z$^{-1}$).

The threshold module 452 may process both the small frequency modulation (FM) component 426 and the large frequency modulation (FM) component 428 simultaneously. In other words, the threshold module 452 may provide large frequency modulation (FM) components 428 to the digital frequency offset generator 232 while also providing small frequency modulation (FM) components 426 to the direct modulation phase lock loop (PLL) 230.

Figure 5:
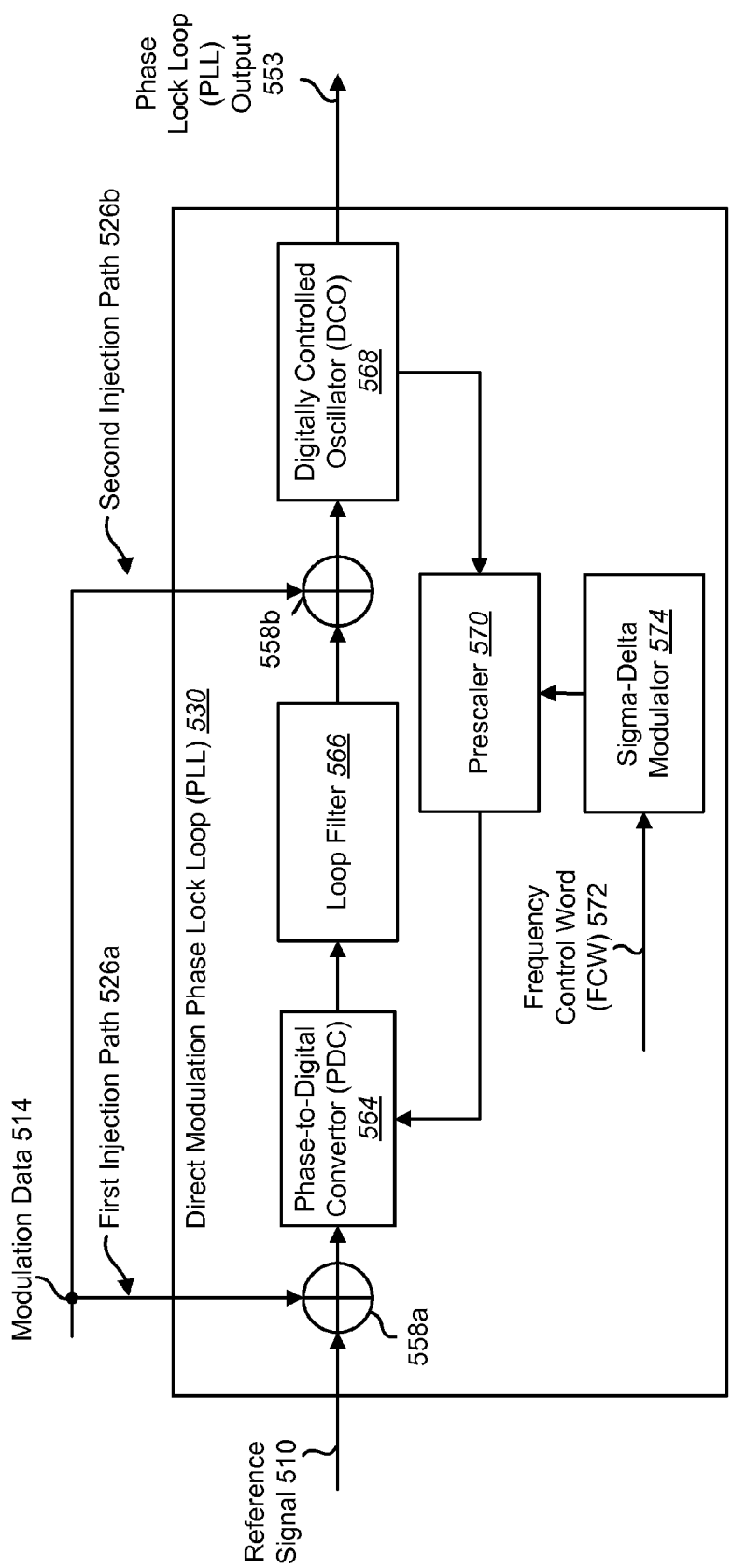
FIG. 5 is a block diagram illustrating one configuration of a direct modulation phase lock loop (PLL)

FIG. 5 is a block diagram illustrating one configuration of a direct modulation phase lock loop (PLL) 530. The direct modulation phase lock loop (PLL) 530 of FIG. 5 may be one configuration of the direct modulation phase lock loop (PLL) 230 of FIG. 2. The direct modulation phase lock loop (PLL) 530 shown is a two point modulation phase lock loop (PLL). However, a one point modulation phase lock loop (PLL) may also be used. The direct modulation phase lock loop (PLL) 530 may be a digital phase locked loop (DPLL). In other words, some components within the direct modulation phase lock loop (PLL) 530 may be implemented using digital circuitry. For example, the direct modulation phase lock loop (PLL) 530 may include a phase-to-digital converter (PDC) 564 and a loop filter 566 that are implemented digitally using the reference signal 510. The phase-to-digital converter (PDC) 564 may determine a phase difference between the reference signal 510 and the output of a prescaler 570. In one configuration, the prescaler 570 may be controlled by a sigma delta modulator 574. In some configurations, the sigma delta modulator 574 may be based on a frequency control word (FCW) 572. The loop filter 566 may then provide an output signal to a digitally controlled oscillator (DCO) 568.

Modulation data 514 may be injected into the direct modulation phase lock loop (PLL) 530. The injected data may be obtained from the small frequency modulation (FM) component 426. In some instances, the direct modulation phase lock loop (PLL) 530 injects the small frequency modulation (FM) component 426 through a two point injection. In one configuration, modulation data 514 may be injected in two locations. The first injection path 526a may be added with the reference signal 510 and input to the phase-to-digital converter (PDC) 564 using an adder 558a. In some instances, this first injection path 526a may be a low-pass path.

The second injection path 526b may be added to the output of the loop filter 566 using an adder 558b. In one configuration, the second injection path 526b may be multiplied by a high-pass gain (ku) (not shown) before being added to the loop filter 566 output at the adder 558b. The output of the adder 558b may be provided to the digitally controlled oscillator (DCO) 568. The digitally controlled oscillator (DCO) 568 may output a feedback signal to the prescaler 570 and a phase lock loop (PLL) output 553. In some cases, this second injection path 526b may be a high-pass path.

It should be noted that while a two point direct modulation phase lock loop (PLL) 530 is described, a number of other low noise systems may be employed to process the small frequency modulation (FM) component 426. For example, any direct modulation phase lock loop (PLL) may be employed, such as a single point injection phase lock loop (PLL) or a two-point injection phase lock loop (PLL) with the radio frequency (RF) voltage controlled oscillator (VCO) gain ($K_{VCO}$) linearized by a frequency looked loop (FLL).

Figure 6:
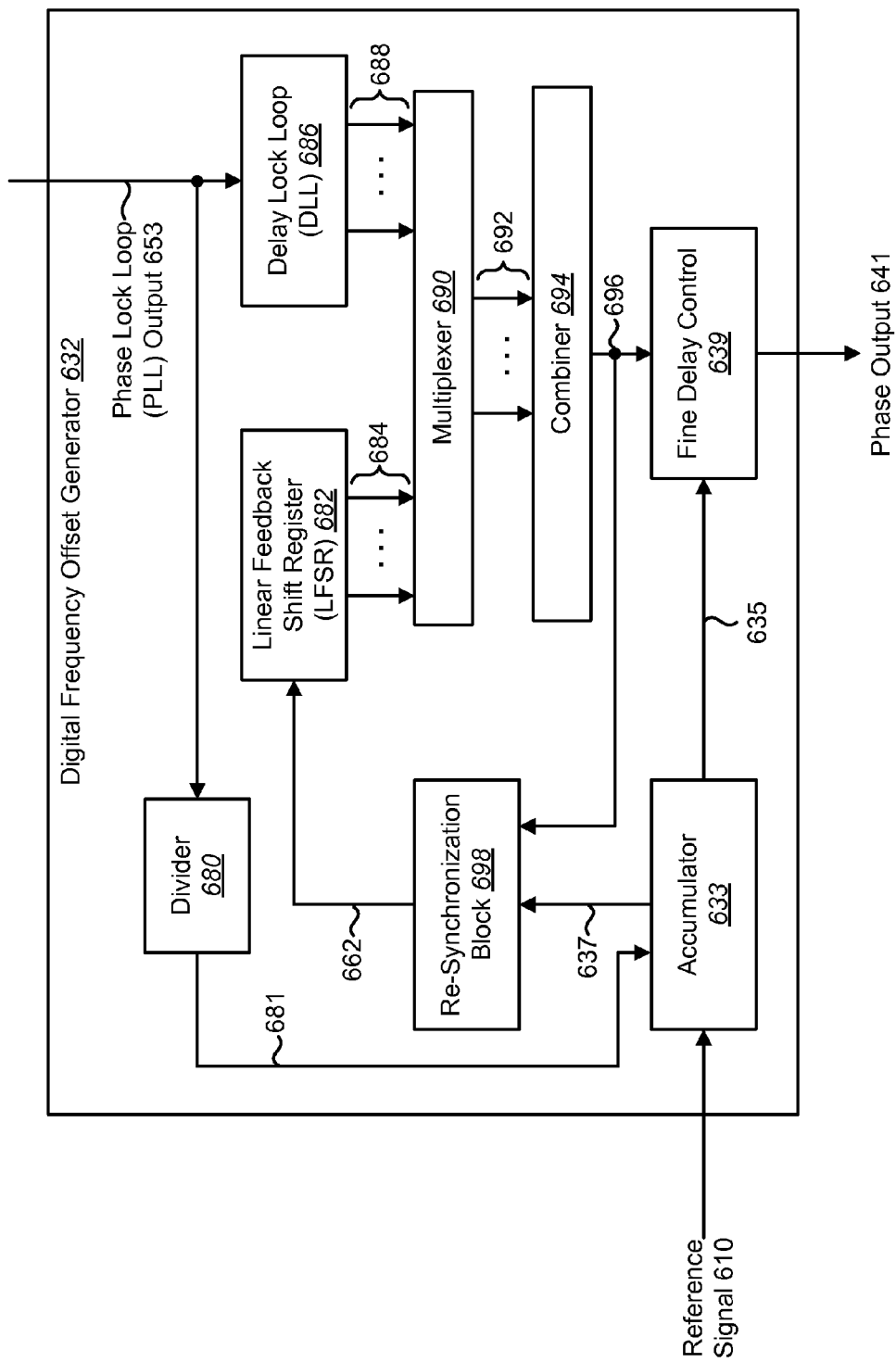
FIG. 6 is a block diagram illustrating one configuration of a digital frequency offset generator.

FIG. 6 is a block diagram illustrating one configuration of a digital frequency offset generator 632. The digital frequency offset generator 632 of FIG. 6 may be one configuration of the digital frequency offset generator 232 of FIG. 2. The digital frequency offset generator 632 may be a digital frequency synthesizer (DFS). The digital frequency offset generator 632 may receive a phase lock loop (PLL) output 653 from the direct modulation phase lock loop (PLL) 530. The phase lock loop (PLL) output 653 may be provided to a delay lock loop (DLL) 686 and/or a divider 680.

The delay lock loop (DLL) 686 provides input in the multiplexer 690. The delay lock loop (DLL) 686 may include one or more delay cells that output delayed signals on one or more delay lines 688. For example, the delay lock loop (DLL) 686 may include an array of inverters coupled to a plurality of delay lines 688.

A bidirectional linear feedback shift register (LFSR) 682 provides additional inputs to the multiplexer 690. The linear feedback shift register (LFSR) 682 may convert a synchronized phase control signal 662 to a parallel linear feedback shift register (LFSR) output signal (Qm) 692. If the phase control signal 637 varies, then the phase output 641 frequency may be modulated accordingly. Alternatively, if the phase control signal 637 is constant, then the phase output 641 may have a fixed frequency.

The parallel linear feedback shift register (LFSR) output signals (Qm) 684 are forwarded to the multiplexer 690. In some configurations, the linear feedback shift register (LFSR) 682 may lock its output signals (Qm) 684 to a coarse output 696. In this case, the course output 696 is input into a re-synchronization block 698 and the synchronized phase control signal 662 is fed back in to the linear feedback shift register (LFSR) 682.

The multiplexer 690 may select a delayed clock signal from a single delay lock loop (DLL) 686 output in the parallel delay lock loop (DLL) output (e.g., delay lines 688), based on the parallel linear feedback shift register (LFSR) output signal (Qm) 684. The selection is made with AND gates at a combiner 694 at which both the delay lock loop (DLL) 686 output (e.g., delay lines 688) and the parallel linear feedback shift register (LFSR) output signal (Qm) 684 are combined. The multiplexer 690 may provide the selected delayed clock signal to the combiner 694 via a parallel output 692.

The combiner 694 combines the parallel output 692 of the multiplexer 690 to form a coarse output 696. In one configuration, an OR gate can be used as the combiner 694. The coarse output 696 may optionally be further refined with a fine delay control 639 and output as a phase output 641 or the coarse output 696 may be directly output as the phase output 641.

The accumulator 633 may receive a reference signal 610 and a divided clock signal 681 having a frequency of (Fin)/m, where "m" is a fractional relation of the synthesized signal to the clock signal. Dividing the clock is optional. In other words, "m" can equal one. The divided clock signal 681 may be received from the divider 680.

In one configuration, the reference signal 610 may have a frequency substantially between 62.5 MHz and 250 MHz. The reference signal 610 may also be digitally pre-compensated to linearize the response of the digital frequency offset generator 632. The accumulator 633 provides a re-synchronizing phase control signal 635 to the fine delay control 639 based on the reference signal 610. The re-synchronizing may occur at a re-synchronization block 698. For example, the re-synchronization block 698 may perform a time algorithm on the phase control signal 637.

Additionally, the accumulator 633 provides a re-synchronizing phase control signal 637 to the linear feedback shift register (LFSR) 682 based on the reference signal 610. The phase control signal 637 enables the linear feedback shift register (LFSR) 682 registers. For instance, every overflow of the accumulator 633 represents an integer phase step. The timing of the phase control signal 637 is relative to the frequency of the fractionally delayed phase lock loop (PLL) output 653 edges created at the delay lock loop (DLL) 686. In other words, the delay lock loop (DLL) 686 output (e.g., delay lines 688) determines the selection rate of the fractionally delayed phase lock loop (PLL) output 653 edges by the multiplexer 690.

The digital bitwidth of the accumulator 633 determines the frequency resolution of the digital frequency offset generator 632 according to Equation (1):

$$\frac{F_{in}}{n*m*\text{bitwidth}}. \qquad (1)$$

In Equation (1), $F_{in}$ is the frequency of the phase lock loop (PLL) output 653, n is the number of delay cells in the delay lock loop (DLL) 686 (e.g., delay units) and m is the fractional relation of the divided clock 681 to the phase lock loop (PLL) output 653. In one configuration, the bitwidth is 28 bits, the delay lock loop (DLL) 686 has 8 delay units and the phase lock loop (PLL) output 653 is divided by 4 to produce a divided clock signal 681. The delay of the phase control signal 637 sent to the linear feedback shift register (LFSR) 682 from the accumulator 633 may need to be compensated for.

Figure 7:
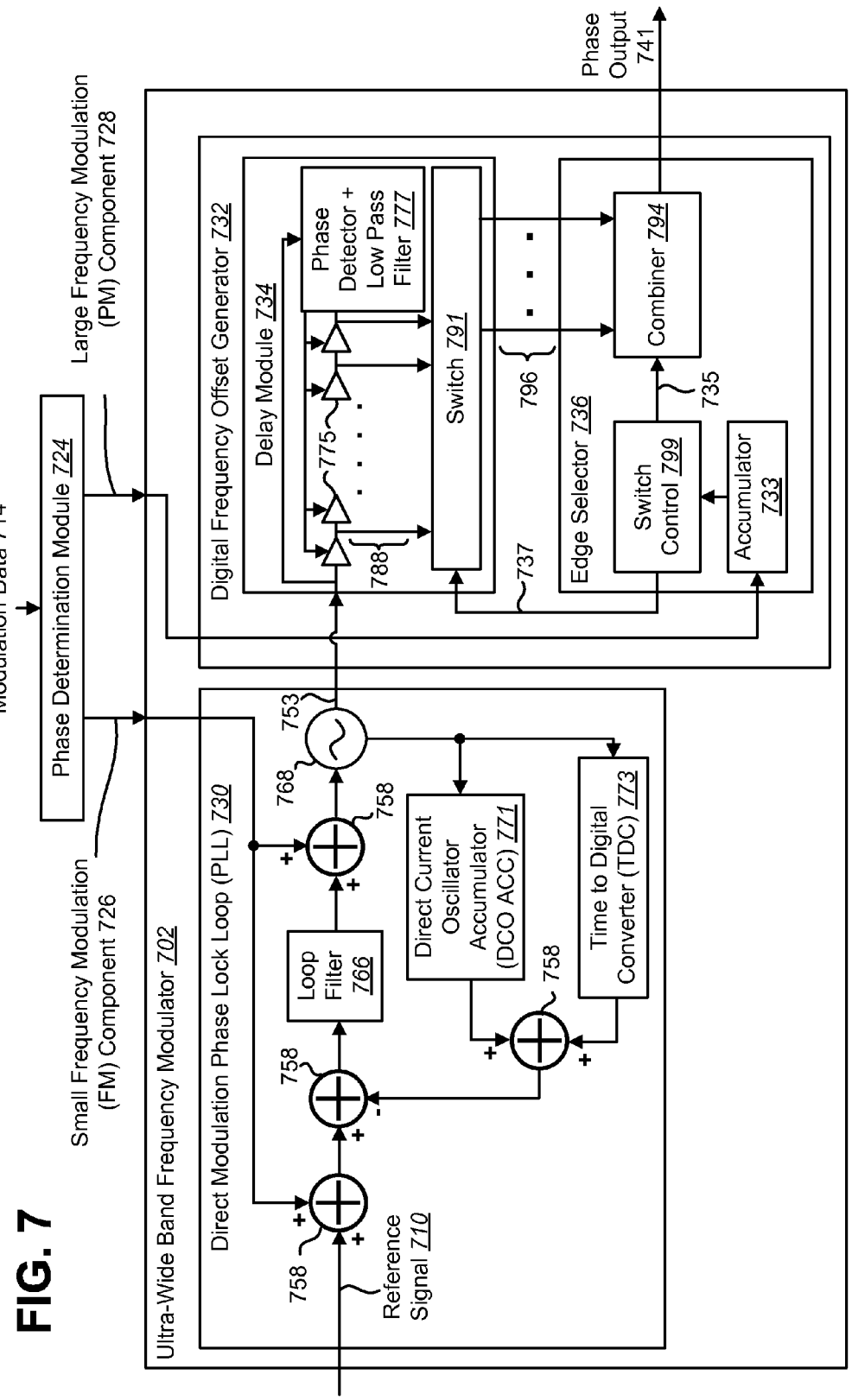
FIG. 7 is a block diagram illustrating another ultra-wideband frequency modulator.

FIG. 7 is a block diagram illustrating another ultra-wideband frequency modulator 702. Modulation data 714 may be provided to a phase determination module 724. The phase determination module 724 may produce a small frequency modulation (FM) component 726 and a large frequency modulation (FM) component 728. In some instances, the phase determination module 724 may be located outside of the ultra-wide band frequency modulator 702.

The small frequency modulation (FM) component 726 and large frequency modulation (FM) component 728 may be fed into the ultra-wide band frequency modulator 702. The ultra-wide band frequency modulator 702 may include a direct modulation phase lock loop (PLL) 730 and a digital frequency offset generator 732. The small frequency modulation (FM) component 726 may be provided to the direct modulation phase lock loop (PLL) 730. In some instances, the direct modulation phase lock loop (PLL) 730 may be a two point modulation phase lock loop (PLL). The phase lock loop (PLL) output signal 753 may be provided to the digital frequency offset generator 732. The direct modulation phase lock loop (PLL) 730 may include similar components as the direct modulation phase lock loop (PLL) 530 discussed above in relation to FIG. 5. For example, the direct modulation phase lock loop (PLL) 730 may include a reference signal 710, summers 758, a loop filter 766, a digitally controlled oscillator (DCO) 768 corresponding to similar number elements 510, 558, 566 and 568 described above in relation to FIG. 5. Additionally, a direct current oscillator accumulator (DCO ACC) 771 and a time to digital converter (TDC) 773 may be included in the direct modulation phase lock loop (PLL) 730. Other components such as a phase-to-digital converter (PDC), a prescaler, a sigma delta modulator, a multiplier, a mixer and/or an accumulator may also be included in the direct modulation phase lock loop (LL) 730.

The digital frequency offset generator 732 may include a delay module 734 and an edge selector 736. The phase lock loop (PLL) output signal 753 may be provided to the delay module 734. The delay module 734 may provide a plurality of delay lines 788 to the edge selector 736. In some configurations, the delay module 734 may provide the delay lines 788 based on divided phase lock loop (PLL) output signal 753 edges.

The delay module 734 may include components such as one or more invertors 775, a switch 791, a phase detector+low pass filter 777, a delay lock loop, a linear feedback shift register (LFSR), etc. The phase detector+low pass filter 777 may be part of a delay lock loop (DLL) 686 and may receive inputs from the phase lock loop (PLL) output signal 753 and the last delay element (e.g., invertor 775). The output of the phase detector+low pass filter 777 may control all the delay cells. The delay module 734 may provide a plurality of delayed signals 796 to the edge selector 736.

The edge selector 736 may receive the plurality of delay lines 788 provided by the delay module 734. In some configurations, the delay lines 788 may be coupled to a switch 791. The edge selector 736 may also receive the frequency modulation (FM) component 728 from the phase determination module 724. The edge selector 736 may produce a phase output signal 741. The edge selector 736 may include components such as one or more accumulators 733, a switch control 799 that performs a time algorithm, a linear feedback shift register, a switch (LFSR), a multiplexer, a combiner 794, a fine delay control, an inverter switch, etc.

In some configurations, the edge selector 736 may process the signal from the plurality of delay lines in multiple stages. The stages may vary according to a set number of bits. For example, the accumulator 733 may be a 26+ bit accumulator. At one stage, the edge selector 736 may perform an edge selection based on 23-26 bits. In another stage, the edge selector 736 may perform an edge selection based on 19-22 bits. In some instances, no processing may occur at the edge selector 736, such as when 0-18 bits are present. If there is an overflow of bits (for example, greater than 26 bits), then the edge selector 736 may use those bits to produce a phase control signal to be fed back to the delay module 734. The accumulator 733 may send a phase control signal 737 based on the number of bits. In some configurations, each overflow of the accumulator 733 represents an integer phase step. Additionally, the switch control 799 may be used to assist in the selection of the phase output 741. For example, a switch control signal 735 may be provided to the combiner 794 to assist the combiner 794 in outputting the appropriate phase output 741 based on the delayed signals 796 received from the delay module 734.

Figure 8:
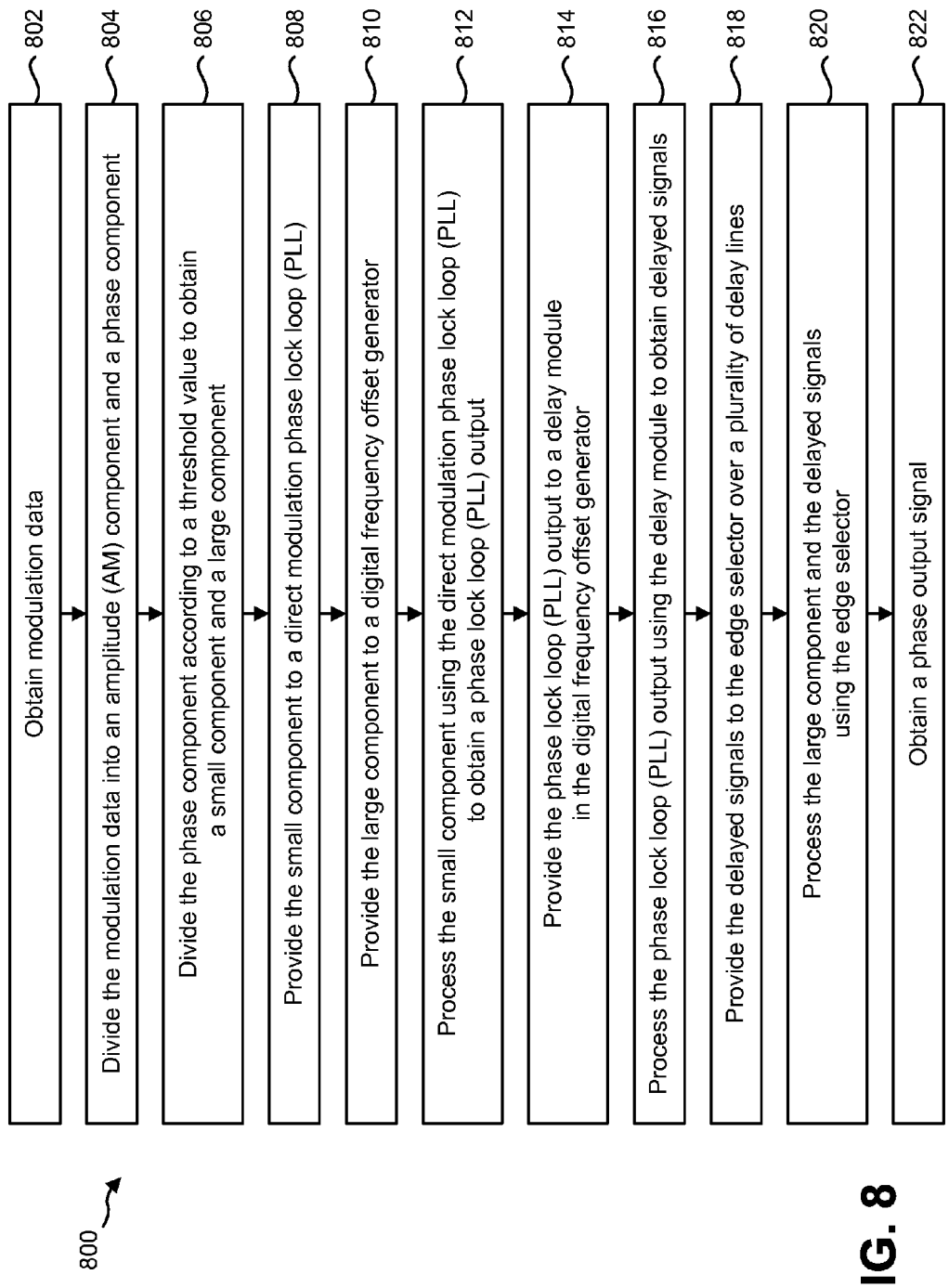
FIG. 8 is a flow diagram of another method for ultra-wideband frequency modulation.

FIG. 8 is a flow diagram of another method 800 for ultra-wideband frequency modulation. The method 800 may be performed by an ultra-wide band frequency modulator 102. The ultra-wide band frequency modulator 102 may obtain 802 modulation data 114. In one configuration, the modulation data 114 may be a complex signal that includes an in-phase component 440 and a quadrature component 442.

The ultra-wide band frequency modulator 102 may divide 804 the modulation data 114 into an amplitude (AM) component 446 and a frequency component 448. In one configuration, the ultra-wide band frequency modulator 102 may divide 804 the modulation data 114 into an amplitude (AM) component 446 and a frequency component 448 using a differentiator 450. In some cases, the differentiator 450 may convert the phase information from the frequency component 448 into frequency information. In other words, the components may be phase components or frequency components.

The ultra-wide band frequency modulator 102 may divide 806 the frequency component 448 according to a threshold value to obtain a small component 226 and a large component 228. For example, the threshold may be 3 MHz.

The ultra-wide band frequency modulator 102 may provide 808 the small component 226 to a direct modulation phase lock loop (PLL) 230. The ultra-wide band frequency modulator 102 may provide 810 the large component 228 to a digital frequency offset generator 232. The ultra-wide band frequency modulator 102 may process 812 the small component 226 using the direct modulation phase lock loop (PLL) 230 to obtain a phase lock loop (PLL) output 253. Once processed, the ultra-wide band frequency modulator 102 may provide 814 the phase lock loop (PLL) output 253 to a delay module 234 in the digital frequency offset generator 232.

The ultra-wide band frequency modulator 102 may process 816 the phase lock loop (PLL) output 253 using the delay module 234 to obtain delayed signals. The ultra-wide band frequency modulator 102 may provide 818 the delayed signals to an edge selector 236 over a plurality of delay lines 288. In some configurations, providing 818 the delayed signals to the edge selector 236 may occur on a single delay line 288 between the delay module 234 and the edge selector 236. In other words, a plurality of delayed signals may be sent on a single delay line 288.

The ultra-wide band frequency modulator 102 may process 820 the large component 228 and the delayed signals using the edge selector 236. The ultra-wide band frequency modulator 102 may obtain 822 a phase output signal 241. In some cases, the phase output signal 241 may be a coarse output 696. Alternatively, the phase output signal 241 may be a refined signal.

Figure 9:
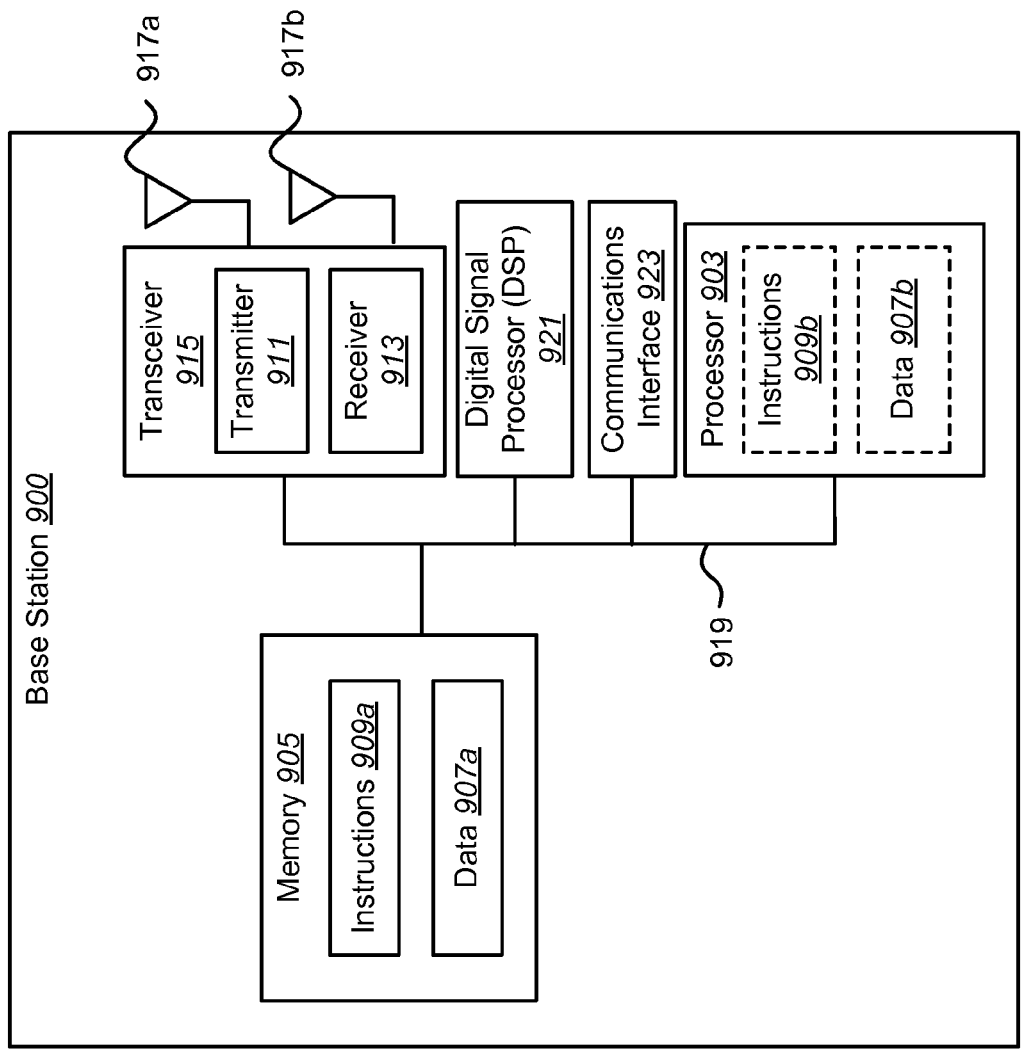
FIG. 9 illustrates certain components that may be included within a base station.

FIG. 9 illustrates certain components that may be included within a base station 900. A base station 900 may also be referred to as, and may include some or all of the functionality of, an access point, a broadcast transmitter, a node B, an evolved node B, etc. For example, the base station 900 may be the wireless device 100 of FIG. 1. The base station 900 may include a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the base station 900 of FIG. 9, in an alternative configuration, a combination of processors (e.g., an ARM and DSP) could be used.

The base station 900 also includes memory 905. The memory 905 may be any electronic component capable of storing electronic information. The memory 905 may be embodied as random access memory (RAM), read only memory (ROM), magnetic disk storage media, optical storage media, flash memory devices in RAM, on-board memory included with the processor, EPROM memory, EEPROM memory, registers and so forth, including combinations thereof.

Data 907a and instructions 909a may be stored in the memory 905. The instructions 909a may be executable by the processor 903 to implement the methods disclosed herein. Executing the instructions 909a may involve the use of the data 907a that is stored in the memory 905. When the processor 903 executes the instructions 909a, various portions of the instructions 909b may be loaded onto the processor 903, and various pieces of data 907b may be loaded onto the processor 903.

The base station 900 may also include a transmitter 911 and a receiver 913 to allow transmission and reception of signals to and from the base station 900. The transmitter 911 and receiver 913 may be collectively referred to as a transceiver 915. The transmitter 911 of FIG. 9 may be one configuration of the transmitter 104 of FIG. 1. Multiple antennas 917a-b may be electrically coupled to the transceiver 915. The base station 900 may also include (not shown) multiple transmitters, multiple receivers, multiple transceivers and/or additional antennas.

The base station 900 may include a Digital Signal Processor (DSP) 921. The base station 900 may also include a communications interface 923. The communications interface 923 may allow a user to interact with the base station 900.

The various components of the base station 900 may be coupled together by one or more buses, which may include a power bus, a control signal bus, a status signal bus, a data bus, etc. For the sake of clarity, the various buses are illustrated in FIG. 9 as a bus system 919.

Figure 10:
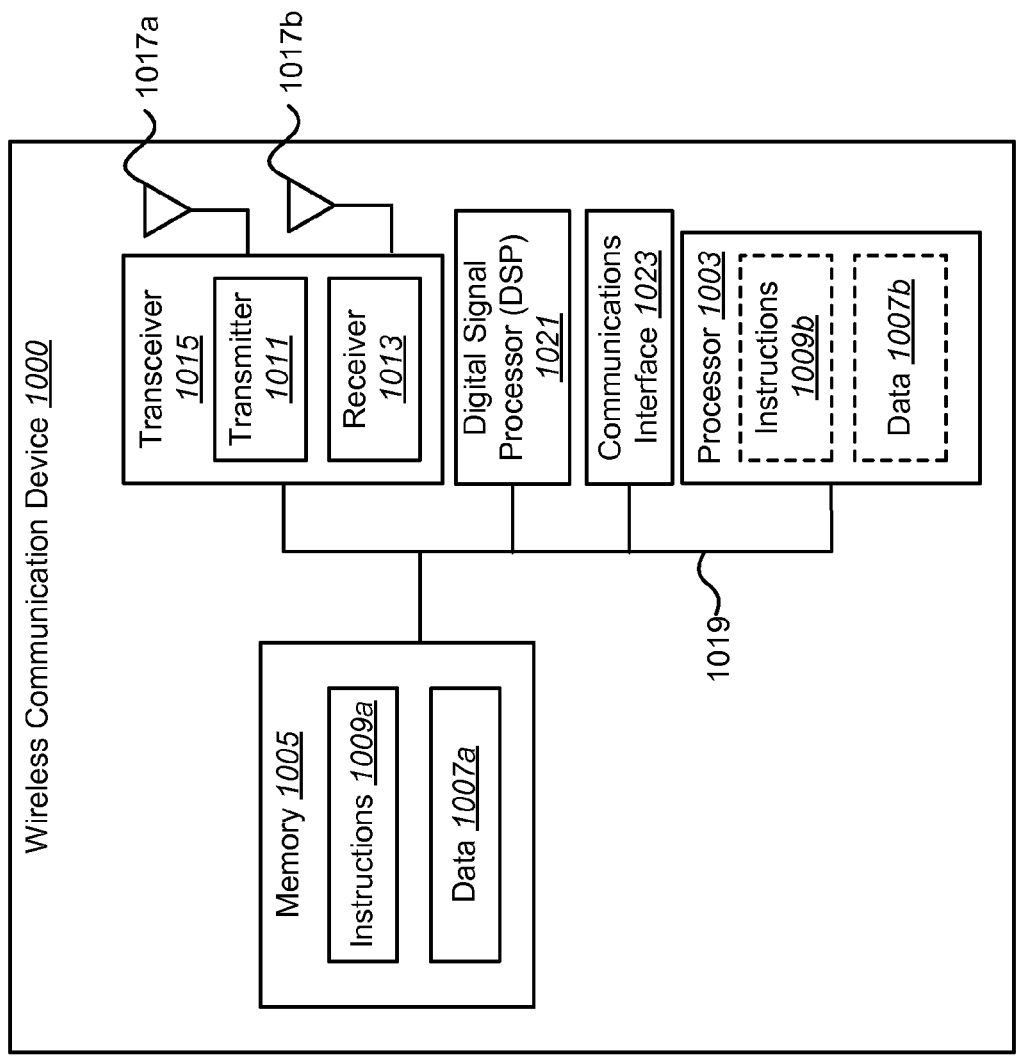
FIG. 10 illustrates certain components that may be included within a wireless communication device.

FIG. 10 illustrates certain components that may be included within a wireless device 1000. The wireless device 1000 may be an access terminal, a mobile station, a user equipment (UE), etc. For example, the wireless device 1000 may be the wireless device 100 of FIG. 1. Additionally or alternatively, the wireless device 1000 may include the transmitter 104 illustrated in FIG. 1. The wireless device 1000 includes a processor 1003. The processor 1003 may be a general purpose single- or multi-chip microprocessor (e.g., an ARM), a special purpose microprocessor (e.g., a DSP), a microcontroller, a programmable gate array, etc. The processor 1003 may be referred to as a central processing unit (CPU). Although just a single processor 1003 is shown in the wireless device 1000 of FIG. 10, in an alternative configuration, a combination of processors (e.g., an ARM and DSP) could be used.

The wireless device 1000 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1007a and instructions 1009a may be stored in the memory 1005. The instructions 1009a may be executable by the processor 1003 to implement the methods disclosed herein. Executing the instructions 1009a may involve the use of the data 1007a that is stored in the memory 1005. When the processor 1003 executes the instructions 1009a, various portions of the instructions 1009b may be loaded onto the processor 1003, and various pieces of data 1007b may be loaded onto the processor 1003.

The wireless device 1000 may also include a transmitter 1011 and a receiver 1013 to allow transmission and reception of signals to and from the wireless device 1000. The transmitter 1011 and receiver 1013 may be collectively referred to as a transceiver 1015. Multiple antennas 1017a-b may be electrically coupled to the transceiver 1015. The wireless device 1000 may also include (not shown) multiple transmitters, multiple receivers, multiple transceivers and/or additional antennas.

The wireless device 1000 may include a Digital Signal Processor (DSP) 1021. The wireless device 1000 may also include a communications interface 1023. The communications interface 1023 may allow a user to interact with the wireless device 1000.

The various components of the wireless device 1000 may be coupled together by one or more buses, which may include a power bus, a control signal bus, a status signal bus, a data bus, etc. For the sake of clarity, the various buses are illustrated in FIG. 10 as a bus system 1019.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements. Digital frequency offset generator The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 3 and 8, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An ultra-wide band frequency modulator, comprising:
  a direct modulation phase lock loop that receives a small component of modulation data;

a delay module that comprises a plurality of delay lines; and an edge selector that receives a large component of the modulation data and a plurality of delayed signals over the plurality of delay lines.

2. The frequency modulator of claim 1, wherein the small component is a phase modulation component and the large component is a phase modulation component.

3. The frequency modulator of claim 1, wherein the small component is a frequency modulation component and the large component is a frequency modulation component.

4. The frequency modulator of claim 3, wherein the small component comprises frequencies at or below 3 megahertz and the large component comprises frequencies above 3megahertz.

5. The frequency modulator of claim 1, wherein the direct modulation phase lock loop is a digital phase lock loop.

6. The frequency modulator of claim 1, wherein the small component is injected into the direct modulation phase lock loop through a two point injection.

7. The frequency modulator of claim 1, wherein the ultra-wide band frequency modulator is a polar modulator.

8. The frequency modulator of claim 1, wherein the direct modulation phase lock loop provides a phase lock loop output signal to the delay module.

9. The frequency modulator of claim 1, wherein the edge selector processes the large component and the plurality of delayed signals to produce a phase output signal.

10. A method for facilitating wireless communication in a wireless network, comprising:
    processing a small component of modulation data by a direct modulation phase lock loop;
    processing a large component of the modulation data by a digital frequency offset generator that comprises a delay module and an edge selector, wherein the delay module comprises a plurality of delay lines to the edge selector; and
    outputting a phase output signal based on the processing of the small component and the processing of the large component.

11. The method of claim 10, further comprising:
    dividing the modulation data into an amplitude component and a frequency component;
    dividing the frequency component according to a threshold value to obtain the small component and the large component; and
    providing the small component to the direct modulation phase lock loop and the large component to the digital frequency offset generator.

12. The method of claim 11, wherein the threshold value is 3 megahertz, wherein the small component is at or below the threshold value, and wherein the large component is above the threshold value.

13. The method of claim 10, wherein the edge selector processes the large component.

14. The method of claim 10, further comprising:
    providing a direct modulation phase lock loop output to the delay module;
    processing the direct modulation phase lock loop output using the delay module to obtain a plurality of delayed signals; and
    providing the plurality of delayed signals to the edge selector over the plurality of delay lines.

15. The method of claim 14, wherein the edge selector processes the large component and the plurality of delayed signals.

16. The method of claim 10, wherein the small component is a phase modulation component and the large component is a phase modulation component.

17. The method of claim 10, wherein the small component is a frequency modulation component and wherein the large component is a frequency modulation component.

18. The method of claim 10, wherein the direct modulation phase lock loop is a digital phase lock loop.

19. The method of claim 10, wherein the small component is injected into the direct modulation phase lock loop through a two point injection.

20. The method of claim 10, wherein the method is performed by a wireless device that comprises an ultra-wide band frequency modulator.

21. The method of claim 20, wherein the ultra-wide band frequency modulator comprises:
    the direct modulation phase lock loop;
    the delay module; and
    the edge selector.

22. The method of claim 20, wherein the ultra-wide band frequency modulator is a polar modulator.

23. An apparatus for facilitating wireless communications in a wireless network, comprising:
    means for processing a small component of modulation data by a direct modulation phase lock loop;
    means for processing a large component of the modulation data by a digital frequency offset generator that comprises a delay module and an edge selector, wherein the delay module comprises a plurality of delay lines to the edge selector; and
    means for outputting a phase signal based on the processing of the small component and the processing of the large component.

24. The apparatus of claim 23, further comprising:
    means for dividing the modulation data into an amplitude component and a frequency component;
    means for dividing the frequency component according to a threshold value to obtain the small component and the large component; and
    means for providing the small component to the direct modulation phase lock loop and the large component to the digital frequency offset generator.

25. The apparatus of claim 23, further comprising:
    means for providing a direct modulation phase lock loop output to the delay module;
    means for processing the direct modulation phase lock loop output using the delay module to obtain a plurality of delayed signals; and
    means for providing the plurality of delayed signals to the edge selector over the plurality of delay lines.

\* \* \* \* \*